(12) United States Patent
Funayoshi et al.

(10) Patent No.: US 11,822,236 B2
(45) Date of Patent: Nov. 21, 2023

(54) MOLD, IMPRINT APPARATUS, AND METHOD OF MANUFACTURING ARTICLE

(71) Applicant: CANON KABUSHIKI KAISHA, Tokyo (JP)

(72) Inventors: Tomomi Funayoshi, Tochigi (JP); Atsushi Kimura, Saitama (JP); Hiroshi Sato, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/742,547

(22) Filed: May 12, 2022

(65) Prior Publication Data

US 2022/0382146 A1     Dec. 1, 2022

(30) Foreign Application Priority Data

May 27, 2021   (JP) ................. 2021-089462

(51) Int. Cl.
*G03F 7/00*     (2006.01)
(52) U.S. Cl.
CPC ................. *G03F 7/0002* (2013.01)
(58) Field of Classification Search
CPC ... G03F 7/00; G03F 9/00; G03F 7/001; G03F 7/005; G03F 7/007; G03F 9/7046; G03F 9/7015; G03F 9/7011; G03F 9/7007; G03F 7/0002; G03F 7/0005; G03F 7/0007; B29C 59/00
See application file for complete search history.

(56) References Cited

U.S. PATENT DOCUMENTS

| 2018/0004091 | A1* | 1/2018 | Shinoda | ................ G03F 7/0002 |
| 2020/0001599 | A1* | 1/2020 | Traub | ..................... B41J 29/393 |
| 2020/0319547 | A1* | 10/2020 | Shinoda | ............. G03F 7/70683 |

FOREIGN PATENT DOCUMENTS

JP     2018006553 A     1/2018

* cited by examiner

*Primary Examiner* — S. Behrooz Ghorishi
*Assistant Examiner* — John W Hatch
(74) *Attorney, Agent, or Firm* — ROSSI, KIMMS & McDOWELL LLP (57) ABSTRACT

The present invention provides a mold including a pattern to be transferred to an imprint material on a substrate using an imprint apparatus, the mold including: a pattern region in which the pattern is arranged; and a peripheral region surrounding the pattern region and configured to shield light, wherein the pattern region includes a first portion, which is arranged with a mark used to measure a relative position with respect to a substrate mark provided on the substrate and through which an image of the substrate mark passes, and a second portion through which an image of a stage mark provided on a stage holding the substrate passes.

11 Claims, 8 Drawing Sheets

MOLD, IMPRINT APPARATUS, AND METHOD OF MANUFACTURING ARTICLE

BACKGROUND OF THE INVENTION

Field of the Invention

The present invention relates to a mold, an imprint apparatus, and a method of manufacturing an article.

Description of the Related Art

As one of lithography apparatuses for manufacturing a semiconductor device, a magnetic storage medium, or the like, an imprint apparatus is known that forms a pattern of an imprint material on a substrate using a mold (template) including a pattern region. In the imprint apparatus, after bringing the imprint material supplied onto a shot region of the substrate into contact with the pattern region of the mold, light is applied to the imprint material in this state to cure the imprint material, and the mold is separated from the cured imprint material. With this, the pattern formed in the pattern region of the mold can be transferred to the imprint material on the shot region of the substrate.

In the imprint apparatus, in a contact step of bringing the mold into contact with the imprint material on the shot region, the imprint material may extrude from the shot region. If the imprint material extruding from the shot region is cured, the mold comes into contact with the extruding imprint material in a contact step for the adjacent shot region, and the extruding imprint material can peel off from the substrate. The imprint material peeled off from the substrate can contaminate the inside of the apparatus as a particle. If the peeled imprint material attaches to the mold and/or the substrate, it can damage the mold and/or the substrate. Japanese Patent Laid-Open No. 2018-6553 proposes a technique in which a light shielding portion that shields curing light for curing the imprint material is provided in the periphery of the pattern region of the mold to avoid curing the imprint material extruding from the shot region.

In the imprint apparatus, for example, when a mold is loaded into the apparatus, a reference mark (stage mark) on a stage for holding a substrate and a mark provided in the mold are detected by a scope to measure the relative position between the stage and the mold. In Japanese Patent Laid-Open No. 2018-6553, the light shielding portion provided in the periphery of the pattern region of the mold is configured to shield curing light for curing an imprint material and transmit detection light for detecting a detection target object. However, such the configuration of the light shielding portion may reduce the degree of freedom of wavelength selection of each of the curing light and the detection light, and increase noise generated during detection of the reference mark.

SUMMARY OF THE INVENTION

The present invention provides, for example, a technique advantageous in detecting a reference mark on a stage when using a mold in which the periphery of a pattern region is configured to shield light.

According to one aspect of the preset invention, there is provided a mold including a pattern to be transferred to an imprint material on a substrate using an imprint apparatus, the mold including: a pattern region in which the pattern is arranged; and a peripheral region surrounding the pattern region and configured to shield light, wherein the pattern region includes a first portion, which is arranged with a mark used to measure a relative position with respect to a substrate mark provided on the substrate and through which an image of the substrate mark passes, and a second portion through which an image of a stage mark provided on a stage holding the substrate passes, and wherein the first portion and the second portion are arranged in the pattern region within a range between 10 μm (inclusive) and 350 μm (inclusive) from a boundary between the pattern region and the peripheral region, in a planar view.

Further features of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

The first embodiment according to the present invention will be described. An imprint apparatus is an apparatus that brings an imprint material supplied onto a substrate into contact with a mold and applying curing energy to the imprint material, thereby forming a pattern of a cured product to which a pattern having concave and convex portions of a mold is transferred. For example, the imprint apparatus supplies a liquid imprint material as a plurality of droplets onto a substrate and, in a state in which a mold (template) formed with a pattern having concave and convex portions is in contact with the imprint material on the substrate, irradiates the imprint material with light to cure the imprint material. Then, the imprint apparatus increases the spacing between the mold and the substrate to separate the mold from the cured imprint material. Thus, the pattern of the mold can be transferred to the imprint material on the substrate. Such a series of processes is called an "imprint process", and is performed for each of a plurality of shot regions of the substrate.

As the imprint material, a curable composition (to be also referred to a resin in an uncured state) that is cured by receiving curing energy is used. As the curing energy, an electromagnetic wave, heat, or the like is used. The electromagnetic wave is light selected from the wavelength range of 10 nm (inclusive) to 1 mm (inclusive), for example, infrared light, a visible light beam, ultraviolet light, or the like.

The curable composition is a composition cured by light irradiation or heating. A photo-curable composition cured by light contains at least a polymerizable compound and a photopolymerization initiator, and may contain a nonpolymerizable compound or a solvent as needed. The nonpolymerizable compound is at least one material selected from the group consisting of a sensitizer, a hydrogen donor, an internal mold release agent, a surfactant, an antioxidant, and a polymer component.

The imprint material is applied in a film shape onto the substrate by a spin coater or a slit coater. Alternatively, the imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

[Arrangement of Imprint Apparatus]

Figure 1:
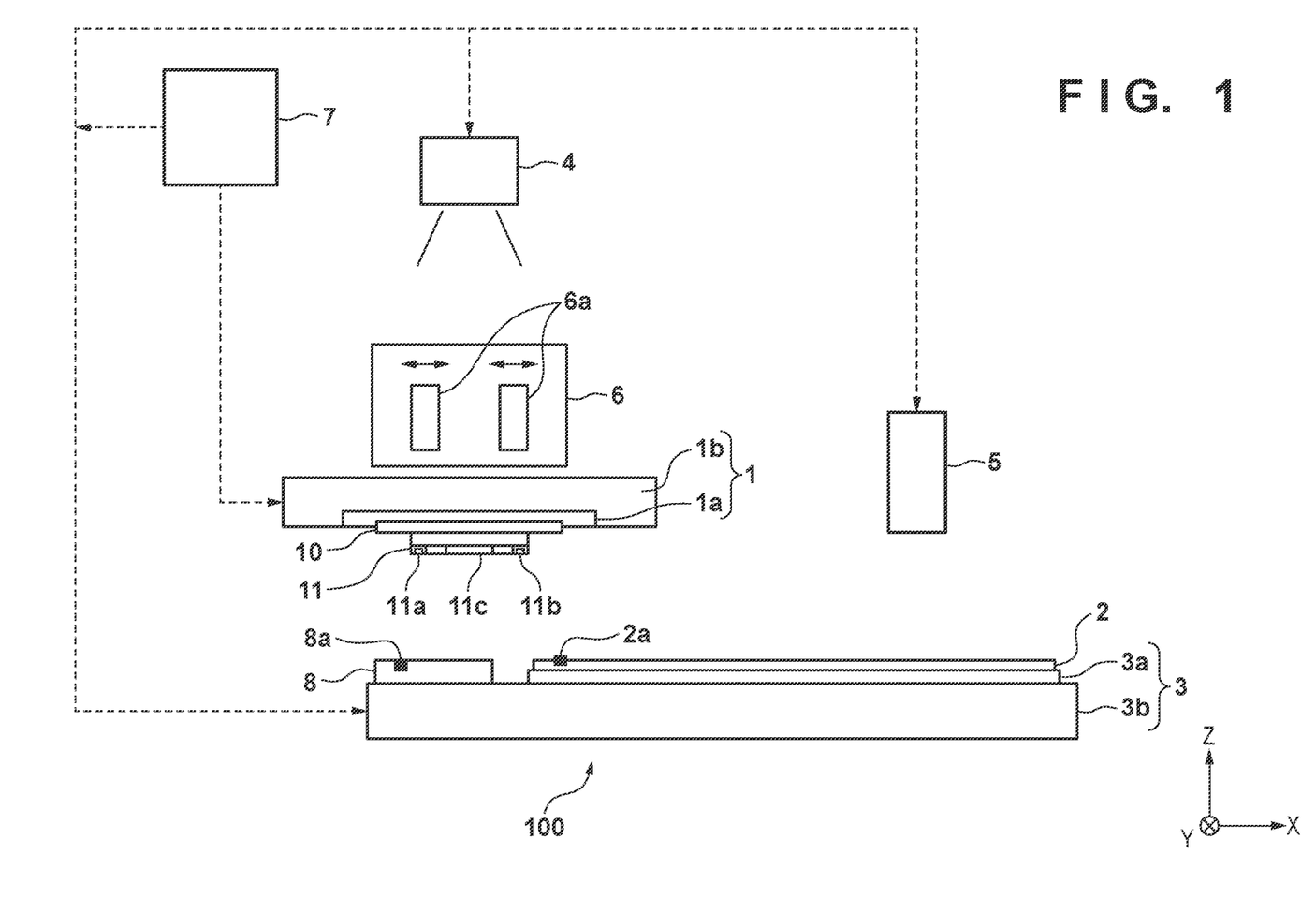
FIG. 1 is a schematic view showing an arrangement example of an imprint apparatus.

FIG. 1 is a schematic view showing an arrangement example of an imprint apparatus 100 according to this embodiment. The imprint apparatus 100 can include, for example, an imprint head 1 that holds a mold 10, a substrate stage 3 that can move while holding a substrate 2, a light irradiation unit 4, a supply unit 5, a detection unit 6, and a controller 7. The controller 7 is formed by, for example, a computer including a CPU (processor) and a memory, and controls respective units of the imprint apparatus 100 to perform (control) an imprint process. Note that the imprint apparatus 100 according to this embodiment employs a photo-curing method of curing an imprint material by irradiating the imprint material with light. Further, in the following description, two directions orthogonal to each other in a plane parallel to the surface of the substrate 2 are assumed to be the X-axis direction and the Y-axis direction, respectively, and a direction perpendicular to the X-axis direction and the Y-axis direction is assumed to be the Z-axis direction. In the following description, the "X-axis direction" can be defined to include the +X direction and the −X direction. This also applies to the "Y-axis direction" and the "Z-axis direction".

The mold 10 is usually formed of a material, such as quartz, capable of transmitting ultraviolet light, and includes, in a partial region (pattern region 11) in the substrate-side surface, a pattern having concave and convex portions to be transferred to an imprint material on the substrate 2 (each shot region). In this embodiment, in the substrate-side surface of the mold 10, the pattern region 11 has a mesa shape protruding toward the substrate side more than a peripheral region 12 surrounding the pattern region 11. A specific arrangement of the mold 10 will be described later. As the substrate 2, glass, ceramic, a metal, a semiconductor, a resin, or the like is used. A member made of a material different from that of the substrate may be formed on the surface of the substrate, as needed. More specifically, the substrate 2 is a silicon wafer, a semiconductor compound wafer, silica glass, or the like. An adhesive layer may be provided before the application of an imprint material to improve the adhesiveness between the imprint material and the substrate, as needed.

The imprint head 1 can include a mold chuck 1a that holds the mold 10 by a vacuum force or the like, and a mold driving mechanism 1b that drives the mold (mold chuck 1a) in the Z-axis direction so as to change the spacing between the mold 10 and the substrate 2. By driving the mold 10 in the Z-axis direction by the imprint head 1, it is possible to perform a contact step of bringing the mold 10 into contact with the imprint material on the substrate 2 (each shot region), and a mold separation step of separating the mold 10 from the cured imprint material. The contact step may be understood as a pressing step of pressing the mold 10 against the imprint material on the substrate 2. The imprint head 1 may be configured to drive the mold 10 not only in the Z-axis direction but also in the X-axis direction, the Y-axis direction, and the θ direction (the rotation direction around the Z-axis).

The substrate stage 3 can include a substrate chuck 3a that holds the substrate 2 by a vacuum force or the like, and a moving mechanism 3b that can support the substrate chuck 3a and move at least in the X-Y direction. By moving the substrate 3 (moving mechanism 3b) in the X-Y direction, it is possible to drive the substrate 2 in the X-Y direction and perform alignment between the mold 10 and the substrate 2. The substrate stage 3 may be configured to drive the substrate 2 not only in the X-Y direction but also in the Z-axis direction or the θ direction.

In this embodiment, the substrate stage 3 is provided with a reference mark 8a (stage mark). More specifically, a reference plate 8 is mounted on the substrate stage 3, and the reference mark 8a is provided in the upper surface of the reference plate 8. The reference plate 8 is preferably formed such that its supper surface is arranged at the same position (height) in the Z-axis direction as the upper surface of the substrate 2 held by the substrate stage 3 (substrate chuck 3a). By detecting the reference mark 8a provided on the substrate stage 3 as described above and a mold mark 13 provided in the mold 10 by a scope 6a (to be described later), the relative position (relative positional relationship) between the substrate stage 3 and the mold 10 can be measured.

The light irradiation unit 4 (curing unit) irradiates, via the mold 10, the imprint material on the substrate with light (for example, ultraviolet light) for curing the imprint material, thereby curing the imprint material. The light irradiation unit 4 can includes, for example, a light source that emits light (curing light) for curing the imprint material, and an optical system configured to adjust the light emitted from the light source to optimal light for the imprint process. The supply unit 5 (discharge unit or dispenser) supplies the imprint material onto the substrate 2 (each shot region). In this embodiment, a resin which is cured by light irradiation can be used as the imprint material. For example, when the supply unit 5 discharges the imprint material as a plurality of droplets onto the substrate in a state in which the substrate 2 is moved with respect to the supply unit 5 by the substrate stage 3, the imprint material can be supplied onto the substrate.

The detection unit 6 (detection optical system) includes the scope 6a that detects, via the mold 10, a substrate mark 2a provided in the substrate 2 and/or the reference mark 8a provided on the substrate stage 3. The scope 6a includes, for example, an image capturing element and an image capturing optical system, and detects (captures) the substrate mark 2a or the reference mark 8a together with the mold mark 13 of the mold 10. In this embodiment, the detection unit 6 detects (captures) the mold mark 13 and the substrate mark 2a in a state in which the mold mark 13 of the mold 10 and the substrate mark 2a of the substrate 2 fit (fall) within the field of view of the scope 6a. With this, the controller 7 can obtain the relative position between the pattern region 11 (mold mark 13) of the mold 10 and the shot region (substrate mark 2a) of the substrate 2 based on the detection result of the detection unit 6. In addition, the detection unit 6 detects (captures) the mold mark 13 and the reference mark 8a in a state in which the mold mark 13 of the mold 10 and the reference mark 8a of the substrate stage 3 fit within the field of view of the scope 6a. With this, the controller 7 can obtain the relative position between the mold 10 (mold mark 13) and the substrate stage 3 (reference mark 8a) based on the detection result of the detection unit 6. Here, the detection unit 6 may include a plurality of the scopes 6a such that it can measure not only the relative position between the pattern region 11 of the mold 10 and the shot region of the substrate 2 but also the shape difference between them.

Although not shown in FIG. 1, the imprint apparatus 100 may also include a deforming unit that deforms the mold 10 (pattern region 11) into a convex shape with the central portion protruding toward the substrate 2. A cavity 14 (core-out portion or concave portion) is formed in the surface of the mold 10 on the opposite side of the surface provided with the pattern region 11. In a state in which the mold 10 is held by the imprint head 1, the cavity becomes a substantially sealed space. The deforming unit can deform the mold 10 (pattern region 11) into a convex shape by controlling the supply of compressed air into the cavity 14 of the mold 10 to adjust the internal pressure of the cavity 14 while the mold 10 is held by the imprint head 1. For example, by deforming the mold 10 into a convex shape in the contact step, the contact area between the mold 10 and the imprint material on the substrate can be gradually increased so that bubbles remaining between the mold 10 and the imprint material can be reduced. That is, it is possible to reduce a defect in the pattern of the imprint material formed on the substrate by the imprint process.

[Arrangement of Mold]

Next, an arrangement example of the mold 10 according to this embodiment will be described. Conventionally, when measuring the relative position between the mold and the substrate stage 3, the scope 6a of the detection unit 6 detects the reference mark 8a of the substrate stage 3 via the peripheral region (that is, the region outside the pattern region) surrounding the pattern region of the mold. However, in recent years, in order to avoid curing the imprint material extruding from the shot region in the contact step, the peripheral region of the mold is configured to shield light by providing a light shielding film or the like. In this case, it can be difficult to simultaneously fit the mold mark 13 and the reference mark 8a within the field of view of the scope 6a and accurately measure the relative position between the mold 10 and the substrate stage 3. Therefore, in the mold 10 according to this embodiment, a first portion 11a, which is arranged with the mold mark 13 and through which the image of the substrate mark 2a passes, and a second portion 11b, through which the image of the reference mark 8a passes, are provided in the pattern region 11.

Figure 2A:
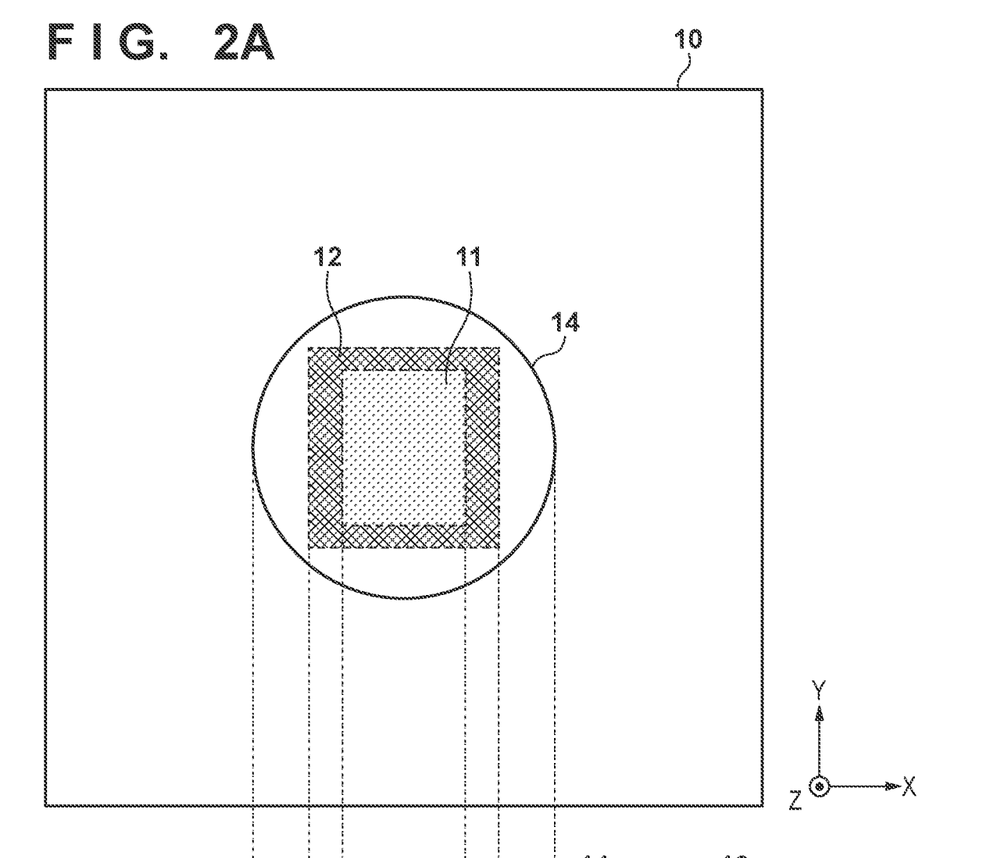
FIGS. 2A and 2B are schematic views showing an arrangement example of an entire mold.
Figure 2B:
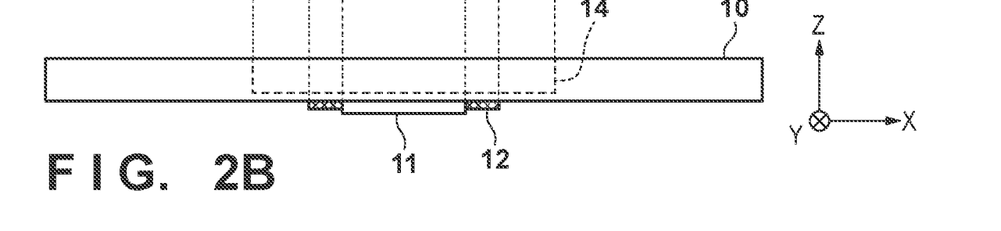

FIGS. 2A and 2B are schematic views showing an arrangement example of the entire mold 10 according to this embodiment. FIG. 2A is a view showing the mold 10 according to this embodiment when viewed from above (+Z direction side), and FIG. 2B is a view showing the mold 10 according to this embodiment when viewed from the side (−Y direction side). The mold 10 includes, in the substrate-side surface, the pattern region 11 where a pattern having concave and convex portions to be transferred to the imprint material on the substrate 2 (each shot region) is arranged, and the peripheral region 12 which shields light in the periphery of the pattern region 11. As has been described above, the pattern region 11 has a mesa shape protruding toward the substrate side more than the peripheral region 12. The peripheral region 12 includes a light shielding film on the substrate-side surface. Further, the mold 10 includes the cavity 14 in the surface on the opposite side of the surface provided with the pattern region 11. The cavity 14 can be formed in the mold 10 so as to have dimensions that include at least the pattern region 11 in a planar view (that is, when viewed from +Z direction). Here, in the example shown in FIG. 2A, the light shielding film is formed on the substrate-side surface in the peripheral region 12. However, the present invention is not limited to this, and the light shielding film may be provided on the surface (for example, inside the cavity 14) on the opposite side of the substrate-side surface.

Figure 3:
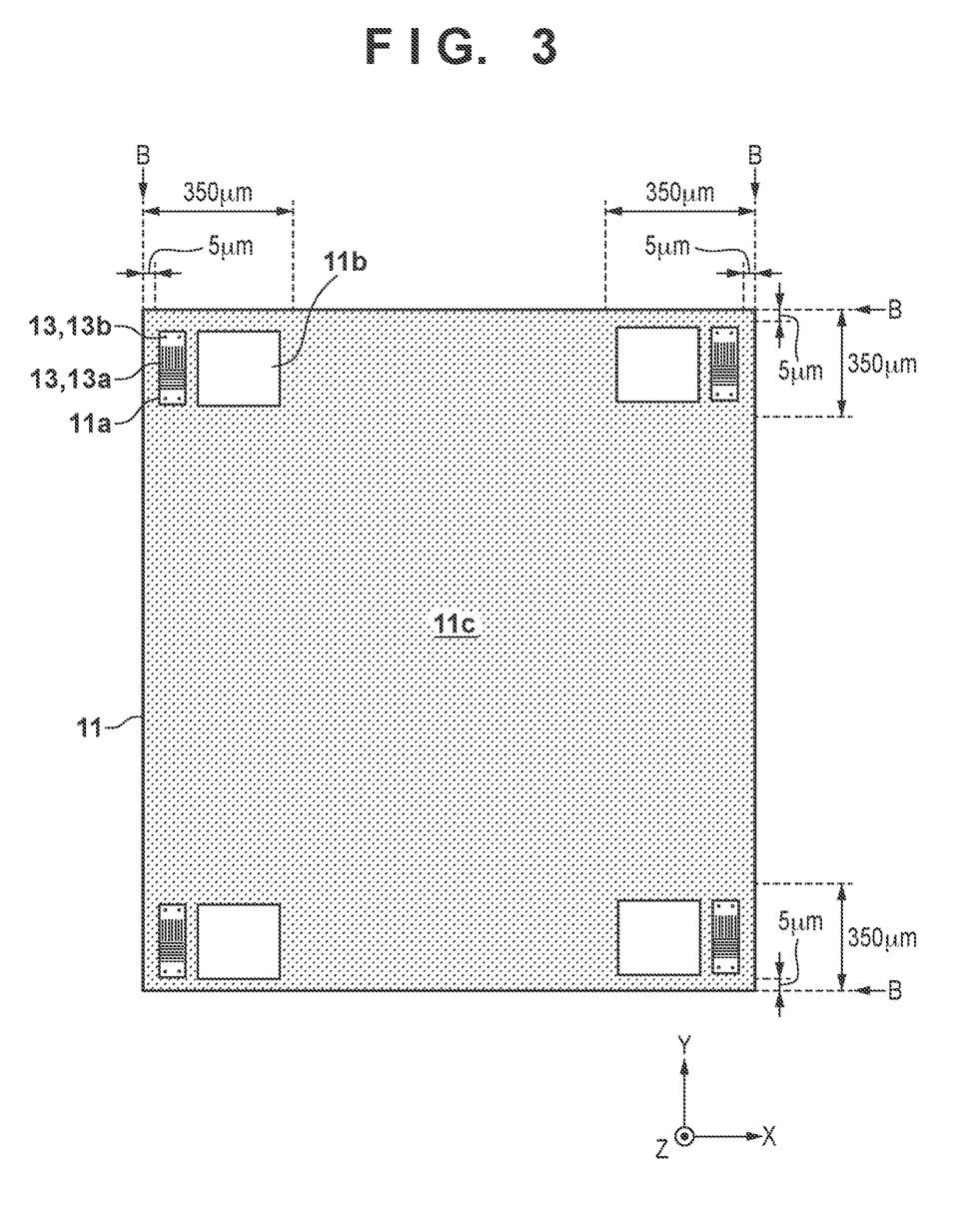
FIG. 3 is a schematic view showing an arrangement example of a pattern region of the mold.

FIG. 3 is a schematic view showing an arrangement example of the pattern region 11 of the mold 10 according to this embodiment. FIG. 3 is a view showing the pattern region 11 alone when viewed from above (+Z direction). As has been described above, the first portion 11a, which is arranged with the mold mark 13 and allows the image of the substrate mark 2a to pass therethrough, and the second portion 11b, which allows the image of the reference mark 8a to pass therethrough, are provided in the pattern region 11 of the mold 10 according to this embodiment. In a portion 11c of the pattern region 11 other than the first portion 11a and the second portion 11b, the pattern having concave and convex portions to be transferred to the imprint material on the substrate is formed.

The first portion 11a and the second portion 11b are arranged in the pattern region 11 within a range between 10 μm (inclusive) and 350 μm (inclusive) from a boundary B between the pattern region 11 and the peripheral region 12 in a planar view. With such the arrangement, it is possible to reduce the influence of the first portion 11a and the second portion 11b on the pattern layout in the pattern region 11. Further, the first portion 11a and the second portion 11b are preferably arranged in the pattern region 11 such that they simultaneously fit within the field of view of the scope 6a of the detection unit 6. With this, the scope 6a can simultaneously detect the image of the mold mark 13 provided in the first portion 11a and the image of the reference mark 8a having passed through the second portion 11b. Hence, the relative position between the mold 10 and the substrate stage 3 can be accurately measured.

Here, it is preferable that a plurality of pairs, each of which includes one first portion 11a and one second portion 11b, are arranged in the pattern region 11. In the example shown in FIG. 3, the pattern region 11 has a rectangular shape, and the pair is arranged at each of four corners of the pattern region 11. With this, the relative position between the mold mark 13 and the substrate mark 2a can be detected in each of the plurality of first portions 11a, so that the relative position (X-Y direction or θ direction) and/or the shape difference between the pattern region 11 of the mold 10 and the shot region of the substrate 2 can be accurately measured. Further, since the relative position between the mold mark 13 and the reference mark 8a can be detected using each of the plurality of second portions 11b, the relative position (X-Y direction or θ direction) between the mold 10 and the substrate stage 3 can be accurately measured.

Figure 4:
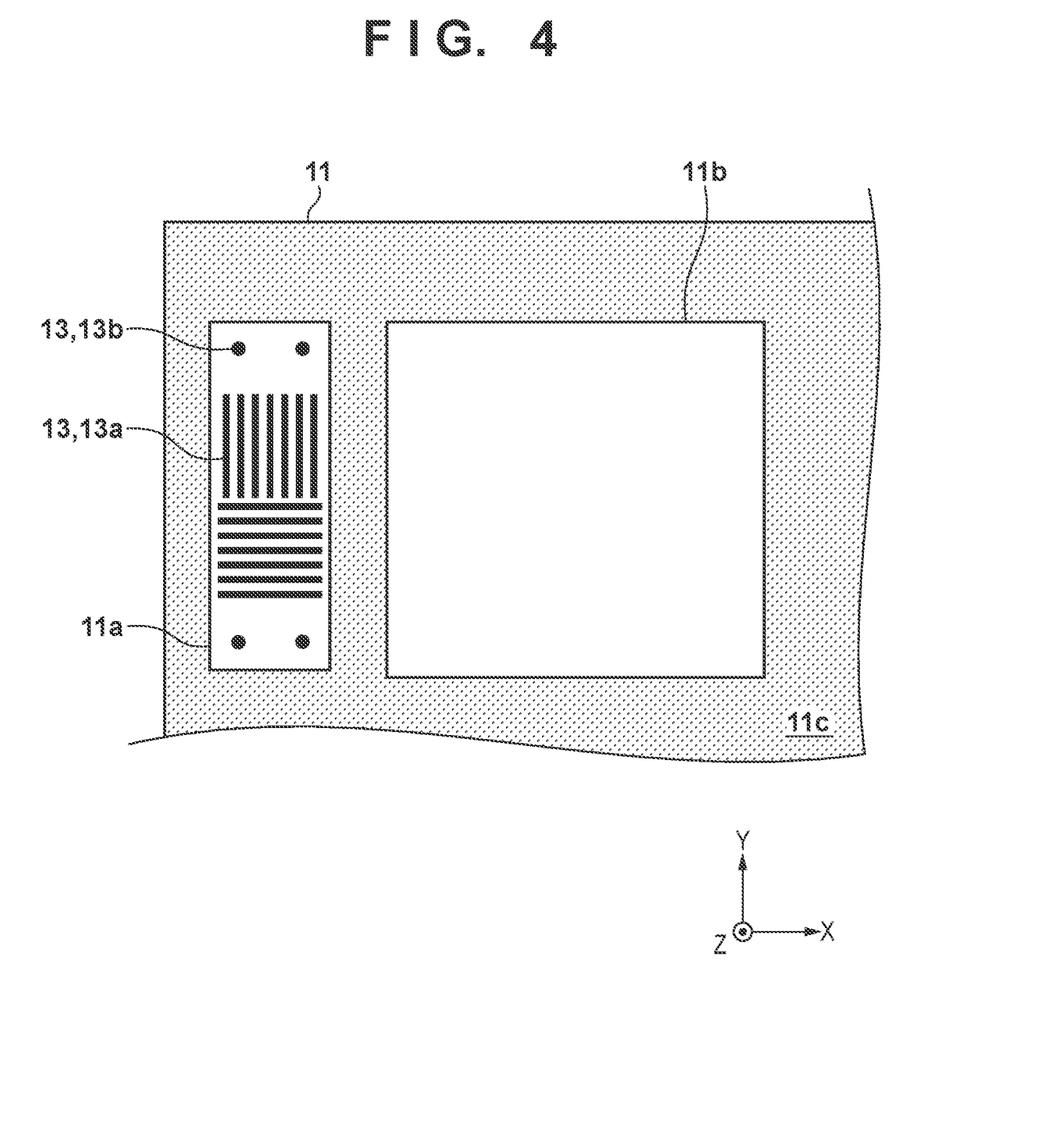
FIG. 4 is a view showing a first portion and a second portion in the pattern region.

FIG. 4 is a view showing the pair formed by one first portion 11a and one second portion 11b, which is an enlarged view of the first portion 11a and the second portion 11b arranged in the upper left portion of the pattern region 11 in the drawing surface of FIG. 3.

The first portion 11a is formed so as to allow the image of the substrate mark 2a provided in the substrate 2 to pass therethrough, and the mold mark 13 used to measure the relative position with respect to the substrate mark 2a is arranged therein. In the example shown in FIG. 4, a fine-detection mark 13a and a rough-detection mark 13b serving as the mold mark 13 are arranged in the first portion 11a. The fine-detection mark 13a is a mark used to detect the relative position between the mold 10 and the substrate 2 with high accuracy. The fine-detection mark 13a can be formed by a diffraction grating which generates a moire fringe when overlapping with the fine-detection mark of the substrate mark 2a. On the other hand, the rough-detection mark 13b is a mark used to detect the relative position between the mold 10 and the substrate 2 with low accuracy. More specifically, the rough-detection mark 13b is a mark used to specify the position of the fine-detection mark. The fine-detection mark 13a and the rough-detection mark 13b will be conceptually described. For example, when the relative position between the mold 10 and the substrate 2 is represented by a two-digit value, the relative position in the tens place can be detected using the rough-detection mark 13b, and the relative position in the ones place can be detected using the fine-detection mark 13a.

The second portion 11b is formed so as to allow the image of the reference mark 8a provided on the substrate stage 3 to pass therethrough. In the second portion 11b, no pattern to be transferred to the imprint material on the substrate is arranged. Alternatively, a pattern formed with dimensions smaller than the spatial resolution of the scope 6a of the detection unit 6 can be arranged in the second portion 11b. The "pattern formed with dimensions smaller than the spatial resolution" is a pattern formed with dimensions that cannot be detected (recognized) by the scope 6a. For example, when the pattern arranged in the second portion 11b is formed by a plurality of line elements (that is, a line-and-space pattern), the dimensions of this pattern can be defined as the line widths and intervals of the line elements that cannot be detected by the scope 6a. Further, the dimensions of the pattern arranged in the second portion 11b can be equal to or smaller than (for example, 1/5, 1/10, or 1/50) the dimensions of the pattern arranged in the portion 11c other than the first portion 11a and the second portion 11b. The pattern arranged in the portion 11c other than the first portion and the second portion may be formed with dimensions smaller than the spatial resolution of the scope 6a.

[Imprint Process]

Figure 5:
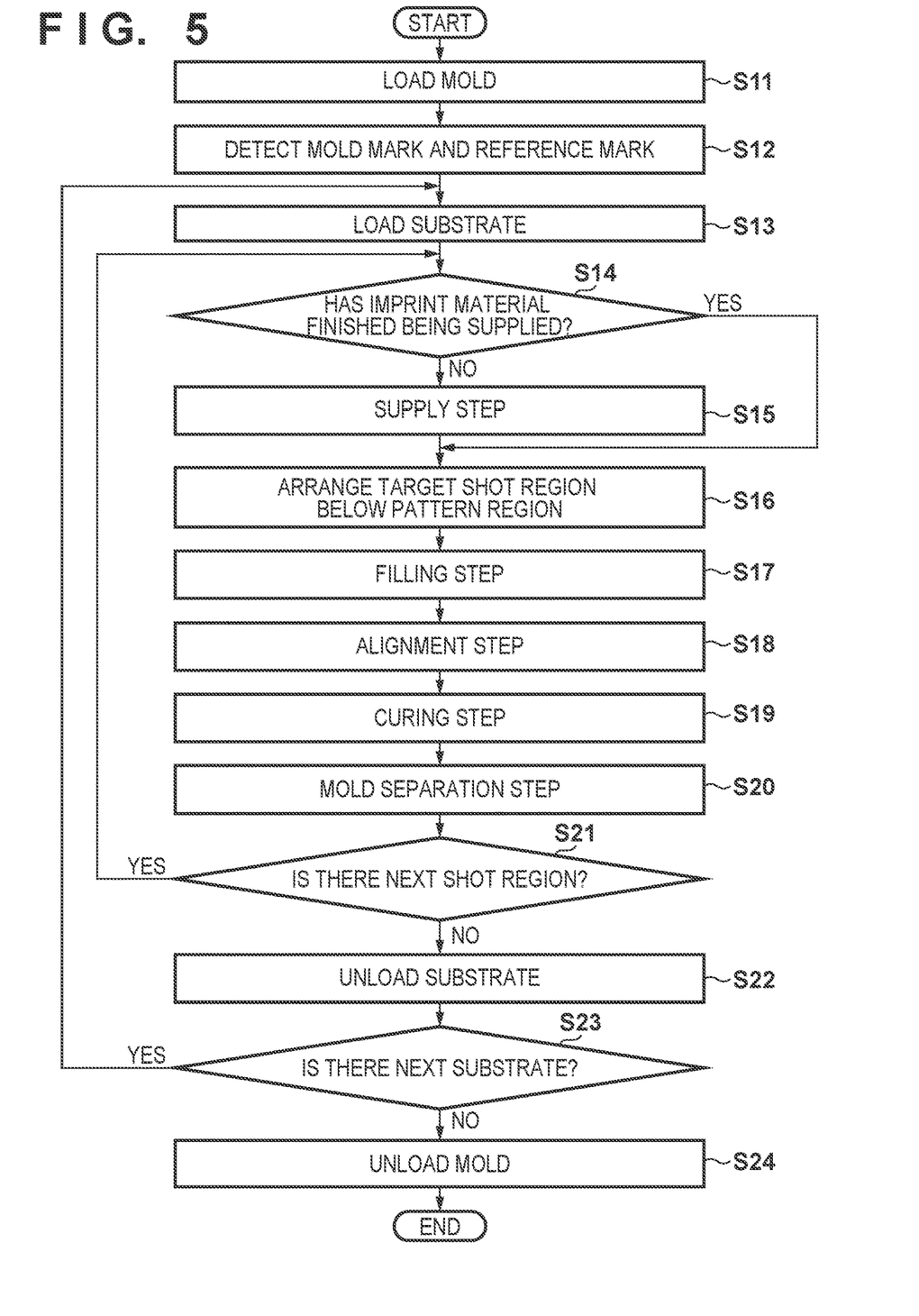
FIG. 5 is a flowchart illustrating an imprint process.

Next, an imprint process performed by the imprint apparatus 100 using the above-described mold 10 will be described. FIG. 5 is a flowchart illustrating the imprint process according to this embodiment. Each step of the flowchart illustrated in FIG. 5 can be controlled by the controller 7.

In step S11, the controller 7 causes a mold conveyance mechanism (not shown) to convey the mold 10 below the imprint head 1 (mold chuck 1a), and causes the mold chuck 1a to hold the mold 10. At this time, the position of the scope 6a is preferably adjusted by a driving mechanism (not shown) such that the first portion 11a and the second portion 11b of the pattern region 11 of the mold 10 are arranged within the field of view of the scope 6a of the detection unit 6.

Figure 6:
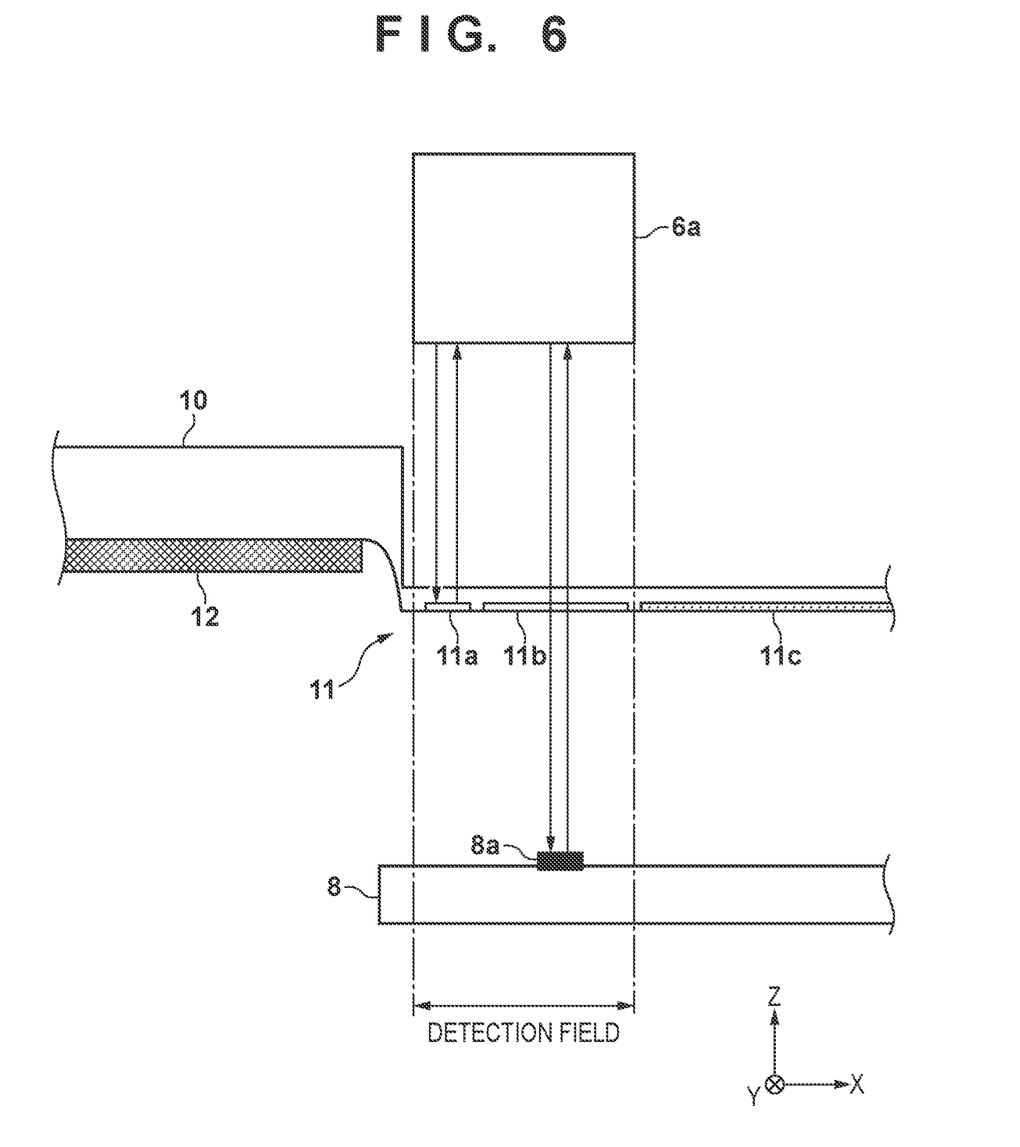
FIG. 6 is a view showing a state in which a scope simultaneously detects a mold mark and a reference mark.

In step S12, the controller 7 moves the substrate stage 3 to arrange the reference mark 8a below the second portion 11b of the mold 10, and causes the scope 6a (detection unit 6) to simultaneously detect the mold mark 13 and the reference mark 8a as shown in FIG. 6. FIG. 6 shows a state in which the scope 6a simultaneously detects the mold mark 13 and the reference mark 8a. The mold mark 13 is the fine-detection mark 13a and/or the rough-detection mark 13b arranged in the first portion 11a. The reference mark 8a is detected by the scope 6a via the second portion 11b of the mold 10. With this step, the controller 7 can obtain the relative position between the mold 10 and the substrate stage 3 based on the detection result of the scope 6a. Hence, it is possible to accurately drive the substrate stage 3 with respect to the mold 10 based on the information of the relative position. Note that in step S12, the scope 6a may simultaneously detect the mold mark 13 and the reference mark 8a in a state in which the mold 10 (pattern region) is deformed into a convex shape as in the actual imprint process. With this, it is possible to obtain the relative position between the mold 10 and the substrate stage 3 at the time of the actual imprint process.

In step S13, the controller 7 causes a substrate conveyance mechanism (not shown) to convey the substrate 2 onto the substrate stage 3 (substrate chuck 3a), and causes the substrate chuck 3a to hold the substrate. Next, in step S14, the controller 7 determines whether the imprint material has been already supplied onto the target shot region on which the imprint process is performed. For example, the controller 7 can obtain information indicating that the imprint material has been supplied onto the substrate 2 by an external apparatus, and make a determination based on this information. If the imprint material has not been supplied onto the target shot region, the process advances to step S15. The controller 7 arranges the target shot region below the supply unit 5, and causes the supply unit 5 to supply the imprint material onto the target shot region (supply step). On the other hand, if the imprint material has been already supplied onto the target shot region, the process advances to step S16.

In step S16, the controller 7 moves the substrate stage 3 to arrange the target shot region below the pattern region 11 of the mold 10. Then, the controller 7 causes the imprint head 1 to drive the mold 10 in the −Z direction to decrease the spacing between the mold 10 and the substrate 2, thereby bringing the mold 10 into contact with the imprint material on the target shot region (contact step). At this time, as has been described above, the controller 7 may cause the deforming unit to deform the mold 10 (pattern region 11) into a convex shape. Then, in step S17, the controller 7 waits until a predetermined time elapses so that the imprint material is filled into the concave portion of the pattern of the mold 10 (filling step).

In step S18, the controller 7 causes the scope 6a (detection unit 6) to simultaneously detect the mold mark 13 and the substrate mark 2a. Based on the relative position between the mold mark 13 and the substrate mark 2a detected by the scope 6a, alignment between the pattern region 11 of the mold 10 and the target shot region of the substrate 2 is performed (alignment step). The substrate mark 2a is arranged at the position in the target shot region corresponding to the mold mark 13 and, similar to the mold mark 13, the substrate mark 2a can include a fine-detection mark and a rough-detection mark. The scope 6a can detect the substrate mark 2a simultaneously (for example, overlapped) with the mold mark 13 via the first portion 11a of the mold 10. Here, in step S18, based on the detection result of the scope 6a, the controller 7 may apply a force to the side surface of the mold 10 or heat the substrate 2 to correct the shape difference between the pattern region 11 and the target shot region.

In step S19, the controller 7 cures the imprint material by irradiating the imprint material with light by the light irradiation unit 4 in a state in which the pattern region 11 of the mold 10 and the imprint material on the target shot region are in contact with each other (curing step). Then, in step S20, the controller 7 causes the imprint head 1 to drive the mold 10 in the +Z direction to increase the spacing between the mold 10 and the substrate 2, thereby separating the mold 10 from the cured imprint material on the target shot region (mold separation step). With this, a pattern formed of a cured product of the imprint material is formed on the target shot region.

In step S21, the controller 7 determines whether there is a shot region (next shot region) on the substrate 2, on which the imprint process is to be performed next. If there is the next shot region, the process returns to step S14, and the imprint process is performed while setting the next shot region as the target shot region. On the other hand, if there is no next shot region, the process advances to step S22, and the controller 7 causes the substrate conveyance mechanism (not shown) to unload the substrate 2 from the substrate stage 3. Then, in step S23, the controller 7 determines whether there is a substrate (next substrate) on which the imprint process is to be performed next. If there is the next substrate, the process returns to step S13, and the imprint process is performed on the next substrate. On the other hand, if there is no next substrate, the process advances to step S24, and the controller 7 causes the mold conveyance mechanism (not shown) to unload the mold 10 from the imprint head 1.

As has been described above, the first portion 11a, which is arranged with the mold mark 13 and through which the image of the substrate mark 2a passes, and the second portion 11b, through which the image of the reference mark 8a passes, are provided in the pattern region 11 of the mold 10 according to this embodiment. With this, even when the peripheral region 12 that shields light is provided in the periphery of the pattern region 11, the scope 6a can simultaneously and accurately detect the reference mark 8a provided on the substrate stage 3 and the mold mark 13. That is, it is possible to accurately measure the relative position between the mold 10 and the substrate stage 3.

Second Embodiment

The second embodiment according to the present invention will be described. In the first embodiment, the example has been described in which only one pair formed by the first portion 11a and the second portion 11b is used in step S12 to detect the mold mark 13 and the reference mark 8a by one scope 6a. However, the present invention is not limited to this. An example will be descried in which, in step S12, each of a plurality of scopes 6a detects a mold mark 13 and a reference mark 8a. Note that this embodiment basically takes over the first embodiment, and the arrangement and processing of an imprint apparatus 100 are similar to those in the first embodiment unless otherwise specified below.

Figure 7:
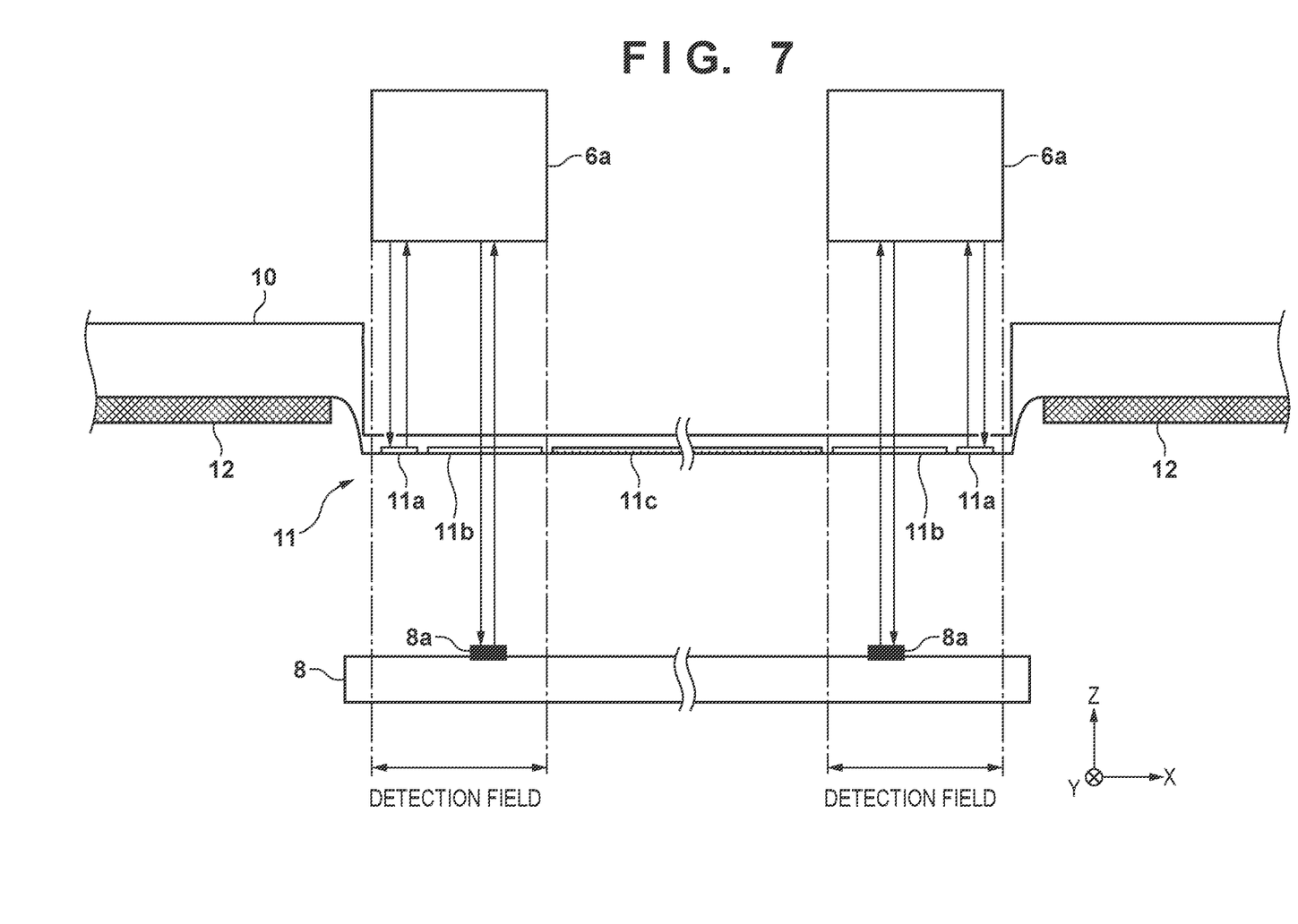
FIG. 7 is a view showing a state in which each of a plurality of scopes simultaneously detects the mold mark and the reference mark.

FIG. 7 shows a state in which each of the plurality of scopes 6a simultaneously detects the mold mark 13 and the reference mark 8a in step S12 described above. More specifically, in a state in which a first portion 11a and a second portion 11b fit in the field of view, each of the plurality of scopes 6a detects the mold mark 13 arranged in the first portion 11a and detects the reference mark 8a via the second portion 11b. As has been described above, a plurality of pairs, each of which is formed by the first portion 11a and the second portion 11b, are arranged in a pattern region 11, and the plurality of scopes 6a are provided so as to correspond to the plurality of pairs, respectively. In this manner, in this embodiment, each of the plurality of scopes 6a detects the mold mark 13 and the reference mark 8a. With this, it is possible to measure not only the position (X-Y direction) of a substrate stage 3 with respect to a mold 10 but also the rotation component (θ direction) of the substrate stage with respect to the mold 10 and the magnification component and trapezoid component of the pattern region 11 of the mold 10.

Third Embodiment

The third embodiment according to the present invention will be described. This embodiment basically takes over the first and second embodiments, and the arrangement and processing of an imprint apparatus 100 are similar to those in the first and second embodiments unless otherwise specified below.

In this embodiment, an example of a method of causing a scope 6a to detect a mold mark 13 and a reference mark 8a will be described. A controller 7 drives a substrate stage 3 in the X-Y direction so as to fit the mold mark 13 and the reference mark 8a within the field of view of the scope 6a, and arranges the reference mark 8a below a second portion 11b of a pattern region 11 of a mold 10. Then, the controller 7 causes an imprint head 1 to drive the mold 10 in the Z-axis direction to arrange a first portion 11a (mold mark 13) and the second portion 11b in the focus plane of the scope 6a. In this state, the scope 6a is caused to detect the mold mark 13 provided in the first portion 11a, and the position of the mold mark 13 in the X-Y direction obtained by this detection is stored. Then, the controller 7 causes the imprint head 1 to drive the mold 10 such that the detection signal of the reference mark 8a obtained by the scope 6a becomes equal to or smaller than a threshold value (for example, such that the line width of the reference mark 8a becomes minimum). In a state in which the detection signal is equal to or smaller than the threshold value, the scope 6a is caused to detect the reference mark 8a via the second portion 11b, and the position of the reference mark 8a in the X-Y direction obtained by this detection is stored. With this, it is possible to accurately measure the relative position between the mold mark 13 and the reference mark 8a, that is, the relative position between the mold 10 and the substrate stage 3.

<Embodiment of Method of Manufacturing Article>

A method of manufacturing an article according to the embodiment of the present invention is suitable for manufacturing an article, for example, a microdevice such as a semiconductor device or an element having a microstructure. The method of manufacturing an article according to the embodiment includes a step of forming a pattern to an imprint material supplied (applied) onto a substrate by using the above-described imprint apparatus (imprint method) and a step of processing the substrate on which the pattern has been formed in the preceding step. Furthermore, this manufacturing method includes other well-known steps (for example, oxidization, deposition, vapor deposition, doping, planarization, etching, resist removal, dicing, bonding, and packaging, and the like). The method of manufacturing an article according to the embodiment is superior to a conventional method in at least one of the performance, quality, productivity, and production cost of the article.

The pattern of a cured material formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile or nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured material is directly used as the constituent member of at least some of the above-described articles or used temporarily as a resist mask. After etching or ion implantation is performed in the substrate processing step, the resist mask is removed.

Figure 8A:
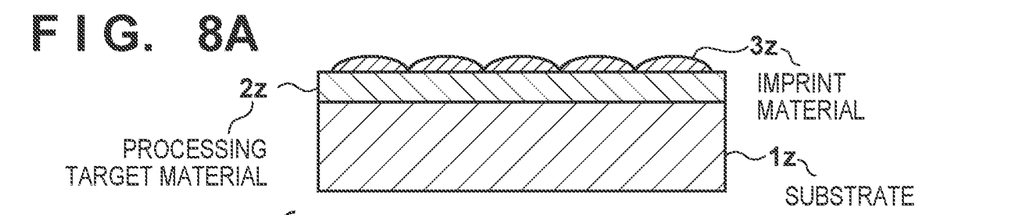
FIGS. 8A to 8F are views for explaining a method of manufacturing an article.

A detailed method of manufacturing an article will be described next. As shown in FIG. 8A, a substrate $1z$ such as a silicon wafer with a target material $2z$ to be processed such as an insulator formed on the surface is prepared. Next, an imprint material $3z$ is applied to the surface of the target material $2z$ by an inkjet method or the like. A state in which the imprint material $3z$ is applied as a plurality of droplets onto the substrate is shown here.

Figure 8B:
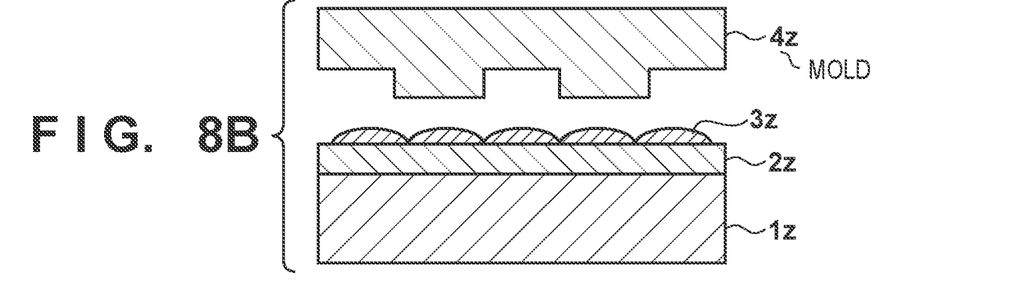
Figure 8C:
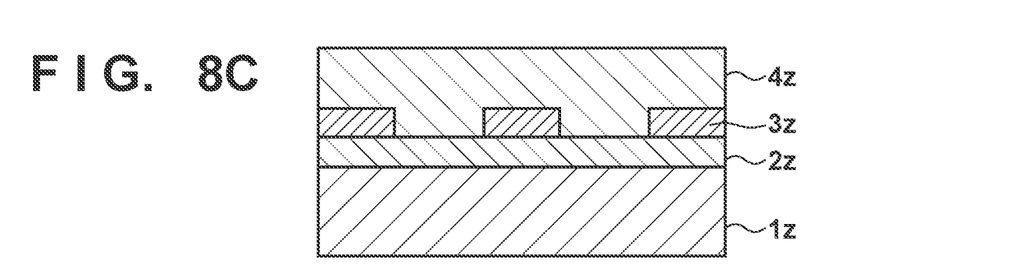

As shown in FIG. 8B, a mold $4z$ for imprint is caused to face to the substrate $1z$ such that a pattern with convex and concave portions formed in the mold $4z$ is directed to the imprint material $3z$ on the substrate $1z$. As shown in FIG. 8C, the mold $4z$ and the imprint material $3z$ applied on the substrate $1z$ are brought into contact with each other, and subjected to a pressure. The gap between the mold $4z$ and the target material $2z$ is filled with the imprint material $3z$. In this state, by irradiating the imprint material $3z$ with energy for curing through the mold $4z$, the imprint material $3z$ is cured.

Figure 8D:
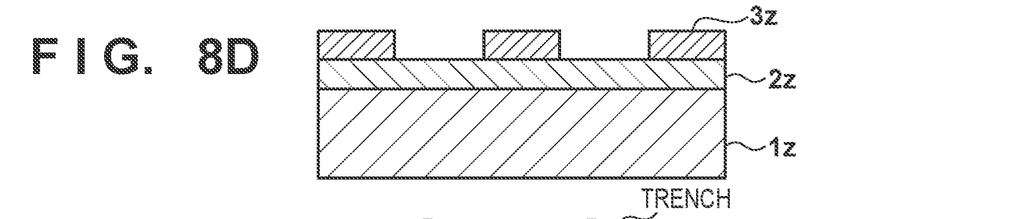

As shown in FIG. 8D, after the imprint material $3z$ is cured, the mold $4z$ is separated from the substrate $1z$. Then, the pattern of the cured material of the imprint material $3z$ is formed on the substrate $1z$. In the pattern of the cured material, the concave portion of the mold corresponds to the convex portion of the cured material, and the convex portion of the mold corresponds to the concave portion of the cured material. That is, the pattern with convex and concave portions in the mold $4z$ is transferred to the imprint material $3z$.

Figure 8E:
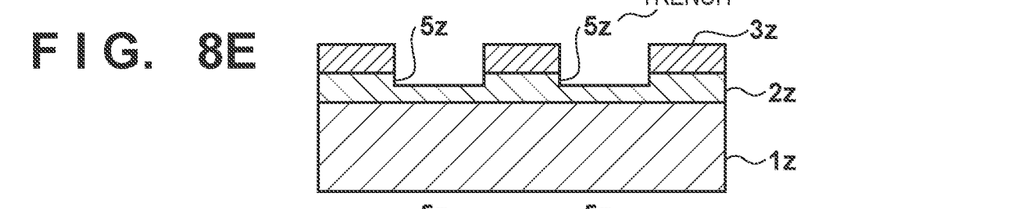
Figure 8F:
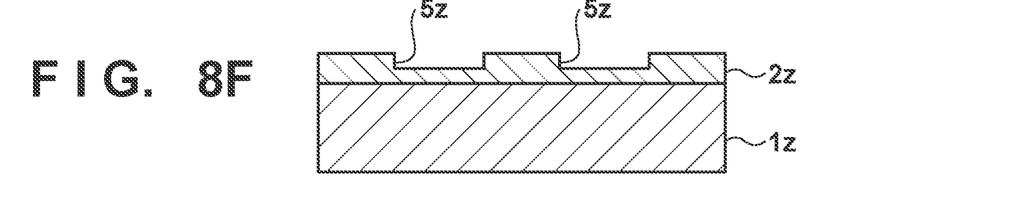

As shown in FIG. 8E, by performing etching process using the pattern of the cured material as an etching resistant mask, a portion of the surface of the target material $2z$ where the cured material does not exist or remains thin is removed to form a groove $5z$. As shown in FIG. 8F, by removing the pattern of the cured material, an article with the grooves $5z$ formed in the surface of the target material $2z$ can be obtained. Here, the pattern of the cured material is removed. However, instead of processing or removing the pattern of the cured material, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-089462 filed on May 27, 2021, which is hereby incorporated by reference herein in its entirety.

What is claimed is:

1. A mold including a pattern to be transferred to an imprint material on a substrate using an imprint apparatus, the mold including:
    a pattern region in which the pattern is arranged; and
    a peripheral region surrounding the pattern region and configured to shield light,
    wherein the pattern region includes a first portion, which is arranged with a mark used to measure a relative position with respect to a substrate mark provided on the substrate and through which an image of the substrate mark passes, and a second portion through which an image of a stage mark provided on a stage holding the substrate passes, and
    wherein the first portion and the second portion are arranged in the pattern region within a range of at least 10 μm and not more than 350 μm from a boundary between the pattern region and the peripheral region, in a planar view.

2. The mold according to claim 1, wherein
    the imprint apparatus comprises a scope configured to detect the stage mark via the second portion, and
    a pattern formed with dimensions smaller than a spatial resolution of the scope is arranged in the second portion.

3. The mold according to claim 1, wherein
    a pattern formed with dimensions not larger than dimensions of a pattern arranged in a portion other than the first portion and the second portion is arranged in the second portion.

4. The mold according to claim 1, wherein
    no pattern is arranged in the second portion.

5. The mold according to claim 1, wherein the pattern region is formed in a mesa shape protruding more than the peripheral region.

6. The mold according to claim 1, wherein
a light shielding film configured to shield light is provided in the peripheral region.

7. The mold according to claim 1, wherein
the imprint apparatus comprises a scope configured to detect the substrate mark via the first portion and detect the stage mark via the second portion, and
the first portion and the second portion are arranged in the pattern region so as to simultaneously fit within a field of view of the scope.

8. The mold according to claim 1, wherein
a plurality of pairs are arranged in the pattern region, each of the plurality of pairs including the first portion and the second portion.

9. The mold according to claim 8, wherein
the pattern region has a rectangular shape, and
the plurality of pairs are respectively arranged at four corners of the pattern region.

10. An imprint apparatus that forms a pattern of an imprint material on a substrate using a mold defined in claim 1, the apparatus comprising:
a stage capable of moving while holding the substrate;
a scope configured to detect, via the mold, a substrate mark provided in the substrate and a stage mark provided on the stage; and
a controller configured to control mark detection by the scope such that the scope detects the substrate mark via a first portion of a pattern region of the mold and the scope detects the stage mark via a second portion of the pattern region.

11. A method of manufacturing an article, the method comprising:
forming a pattern on a substrate by using an imprint apparatus according to claim 10;
processing the substrate, on which the pattern has been formed, to manufacture the article.

* * * * *